US011107656B2

(12) United States Patent
Nomaguchi et al.

(10) Patent No.: US 11,107,656 B2
(45) Date of Patent: Aug. 31, 2021

(54) CHARGED PARTICLE BEAM DEVICE

(71) Applicant: Hitachi High-Tech Corporation, Tokyo (JP)

(72) Inventors: Tsunenori Nomaguchi, Tokyo (JP); Shunichi Motomura, Tokyo (JP); Kenichi Nishinaka, Tokyo (JP); Toshihide Agemura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/616,097

(22) PCT Filed: Jun. 2, 2017

(86) PCT No.: PCT/JP2017/020555
§ 371 (c)(1),
(2) Date: Nov. 22, 2019

(87) PCT Pub. No.: WO2018/220809
PCT Pub. Date: Dec. 6, 2018

(65) Prior Publication Data
US 2020/0211815 A1    Jul. 2, 2020

(51) Int. Cl.
*H01J 37/09* (2006.01)
*H01J 37/244* (2006.01)
(Continued)

(52) U.S. Cl.
CPC ............ *H01J 37/244* (2013.01); *H01J 37/09* (2013.01); *H01J 37/10* (2013.01); *H01J 37/147* (2013.01);
(Continued)

(58) Field of Classification Search
CPC .......... H01J 37/244; H01J 37/09; H01J 37/10; H01J 37/147; H01J 2237/0473;
(Continued)

(56) References Cited

U.S. PATENT DOCUMENTS 5,608,218 A    3/1997   Sato et al.
6,498,345 B1   12/2002  Weimer et al.
(Continued)

FOREIGN PATENT DOCUMENTS

JP    7-192679 A      7/1995
JP    2000-30654 A    1/2000
(Continued)

OTHER PUBLICATIONS

International Search Report (PCT/ISA/210) issued in PCT Application No. PCT/JP2017/020555 dated Aug. 15, 2017 with English translation (four (4) pages).
(Continued)

*Primary Examiner* — Michael Maskell
(74) *Attorney, Agent, or Firm* — Crowell & Moring LLP

(57) ABSTRACT

Signal electrons with high energy that pass near an optical axis, for example, backscattered electrons or secondary electrons in a booster optical system, can be detected. Therefore, there is provided a charged particle beam device including: a charged particle beam source configured to generate a charged particle beam; an objective lens configured to focus the charged particle beam to a sample; and a first charged particle detecting element disposed between the charged particle beam source and the objective lens and configured to detect charged particles generated by an interaction between the charged particle beam and the sample, in which a detection surface of the first charged particle detecting element is disposed on a center axis of the objective lens.

12 Claims, 7 Drawing Sheets

(51) Int. Cl.
*H01J 37/10* (2006.01)
*H01J 37/147* (2006.01)
(52) U.S. Cl.
CPC .............. *H01J 2237/0473* (2013.01); *H01J 2237/2443* (2013.01)
(58) Field of Classification Search
CPC ........... H01J 2237/2443; H01J 37/1472; H01J 2237/0458; H01J 2237/0453; H01J 2237/24475
USPC ...... 250/306, 307, 310, 311, 396 R, 396 ML
See application file for complete search history.

(56) References Cited

U.S. PATENT DOCUMENTS

| | | | |
|---|---|---|---|
| 7,462,828 B2* | 12/2008 | Fukada | G01N 23/2251 250/306 |
| 7,714,287 B1* | 5/2010 | James | H01J 37/28 250/310 |
| 2002/0028399 A1 | 3/2002 | Nakasuji et al. | |
| 2016/0133435 A1* | 5/2016 | Frosien | H01J 37/05 250/397 |
| 2017/0345613 A1 | 11/2017 | Mizuhara et al. | |

FOREIGN PATENT DOCUMENTS

| | | |
|---|---|---|
| WO | WO 02/01596 A1 | 1/2002 |
| WO | WO 2016/092642 A1 | 6/2016 |

OTHER PUBLICATIONS

Japanese-language Written Opinion (PCT/ISA/237) issued in PCT Application No. PCT/JP2017/020555 dated Aug. 15, 2017 (three (3) pages).

* cited by examiner

[FIG. 1]
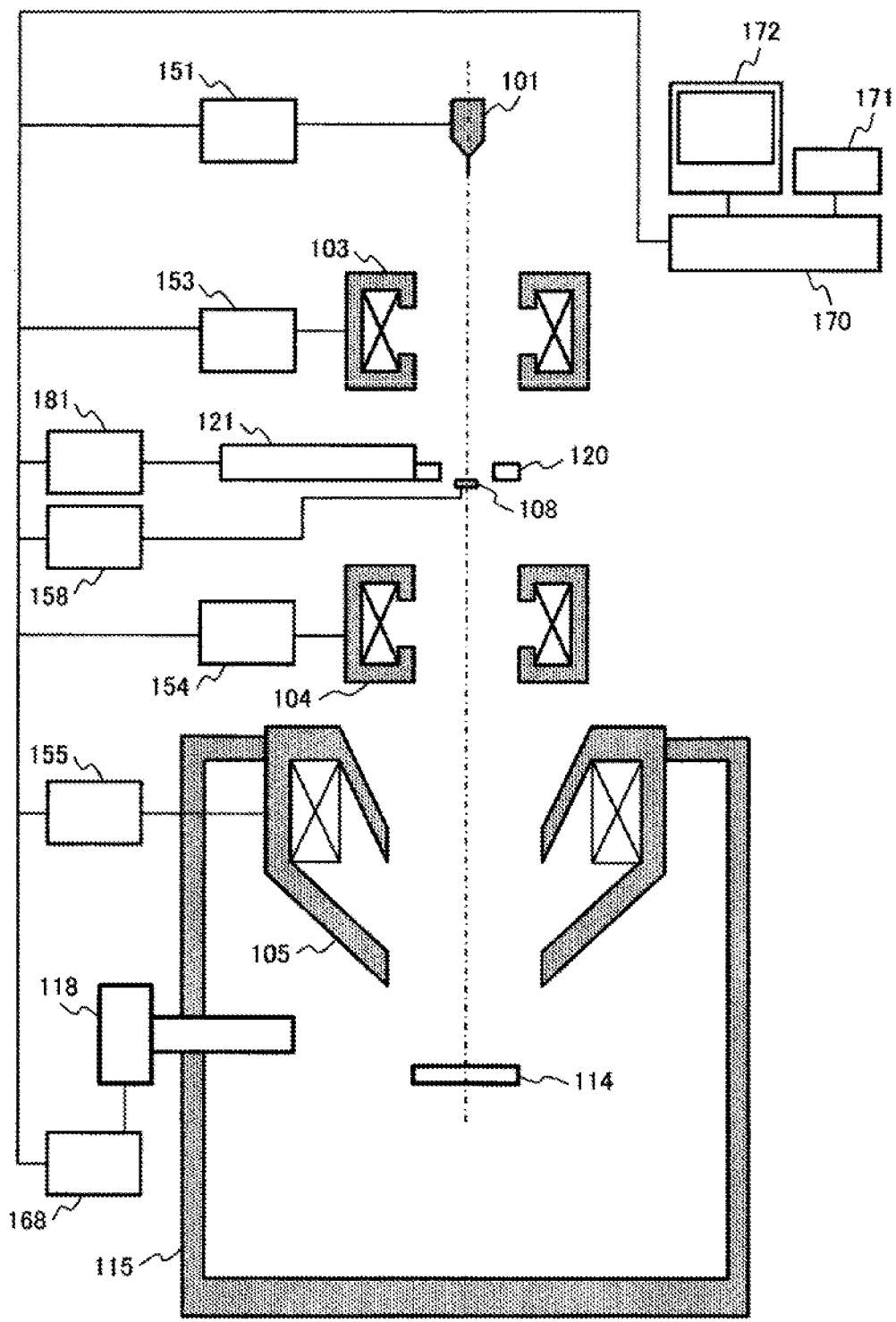

[FIG. 2A]
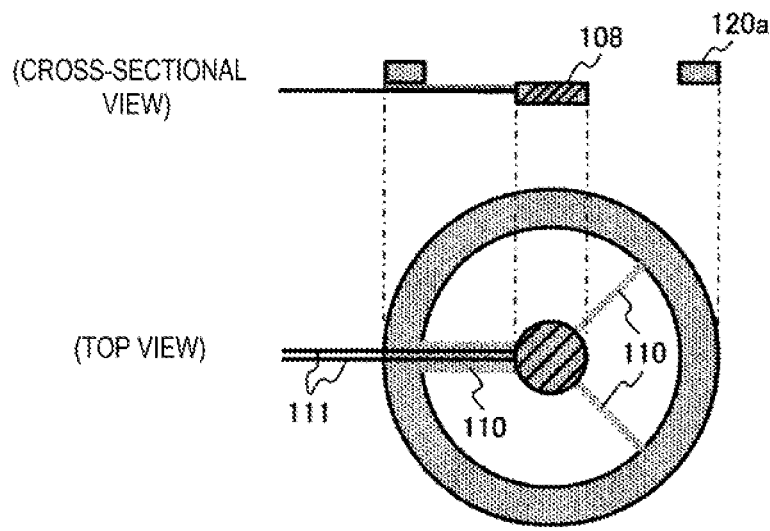
[FIG. 2B]
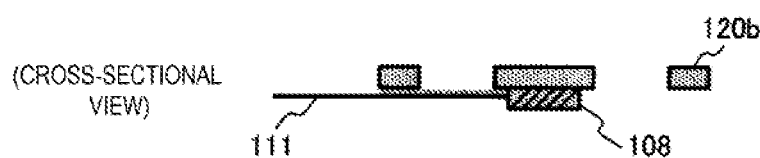
[FIG. 2C]
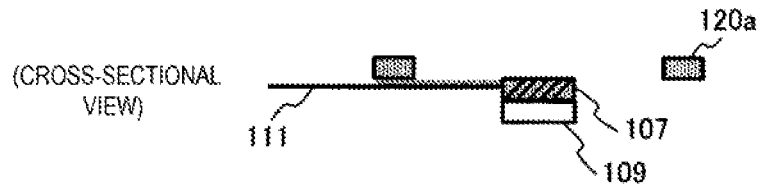

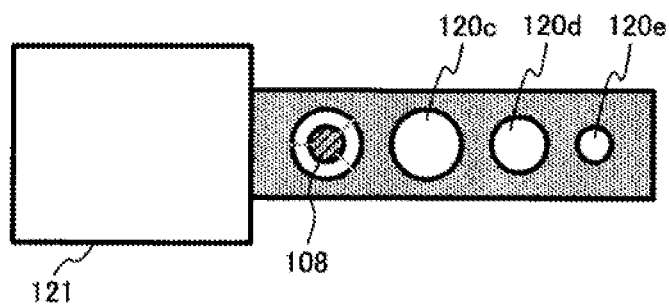
[FIG. 3]

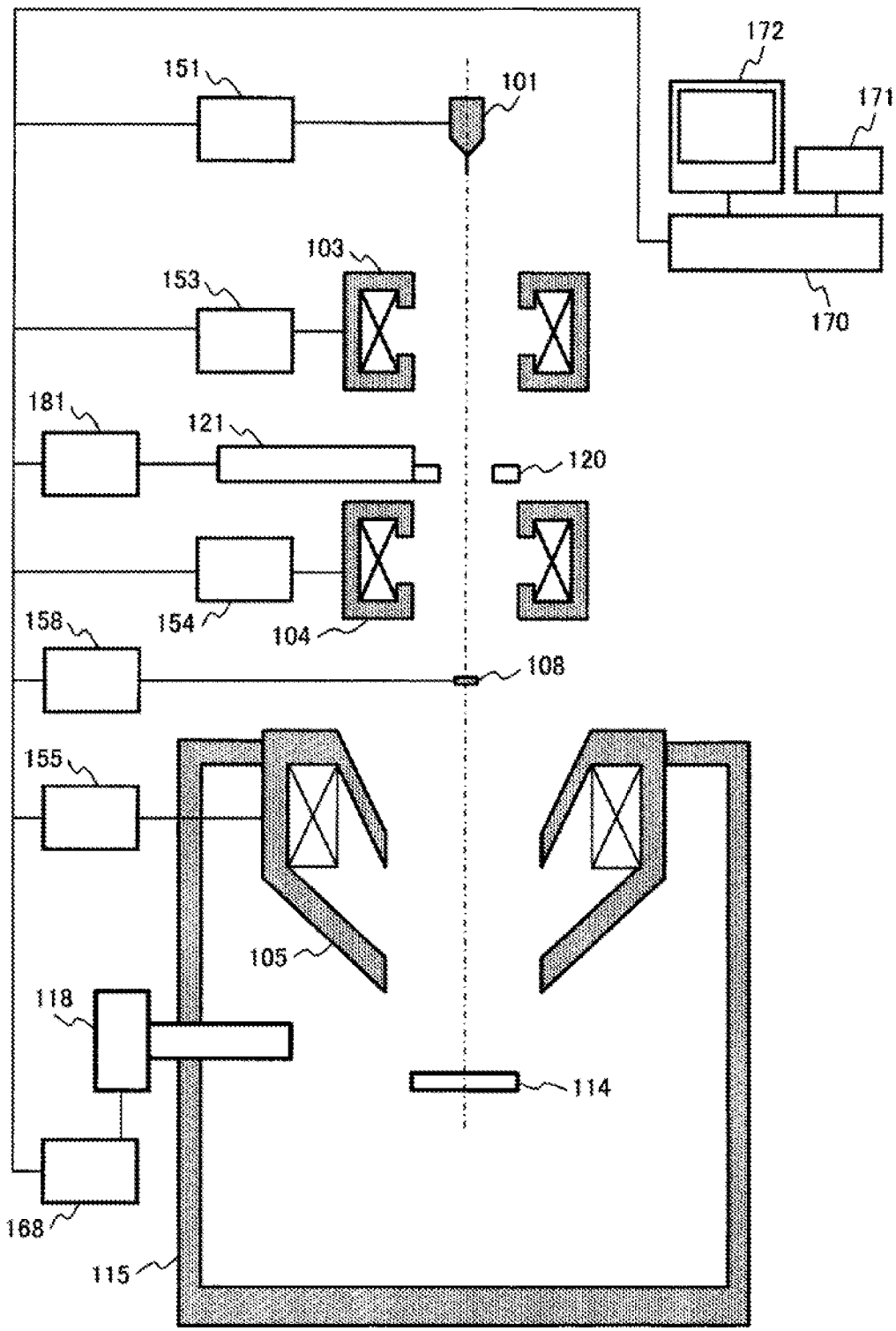
[FIG. 4]

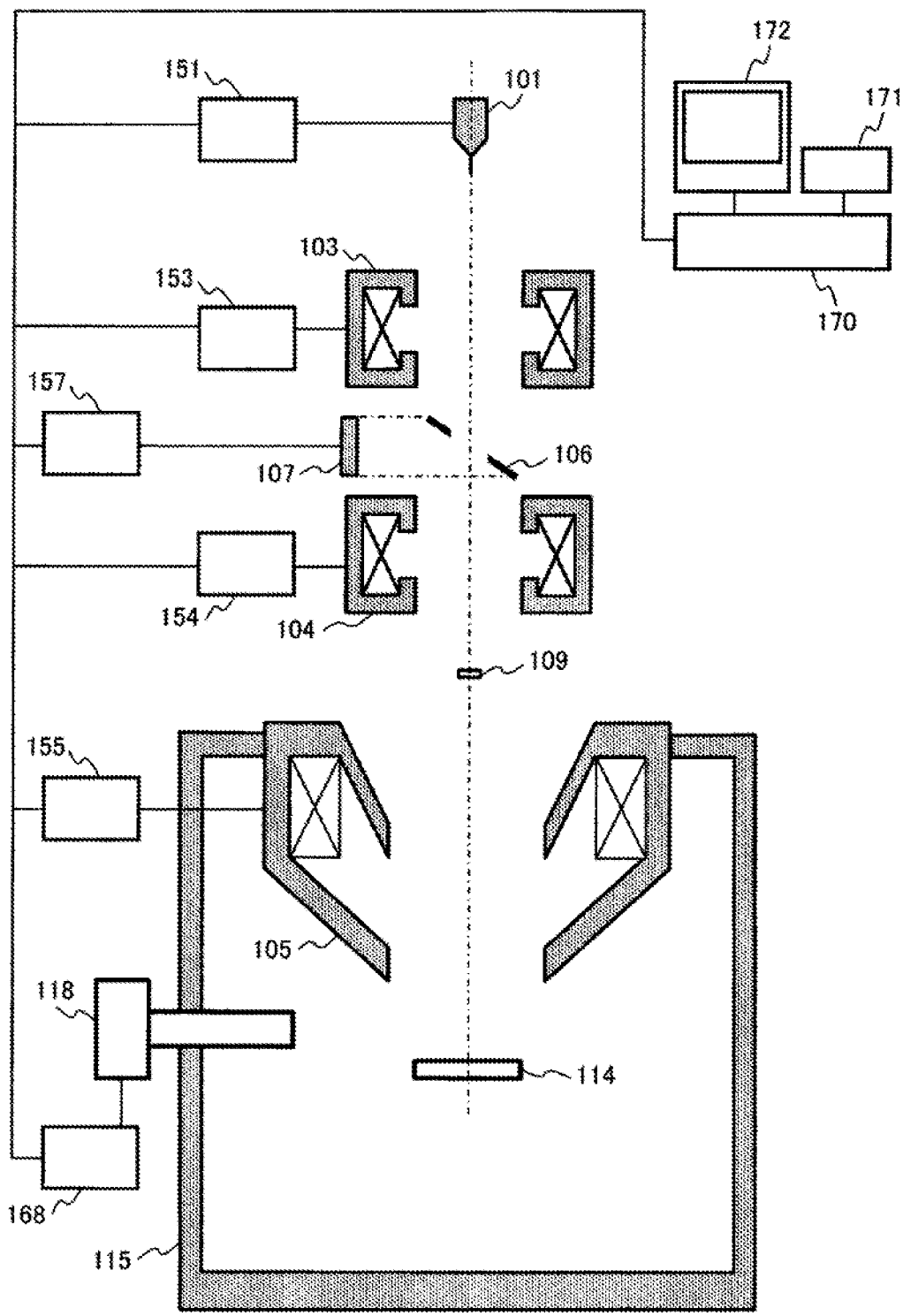
[FIG. 5]

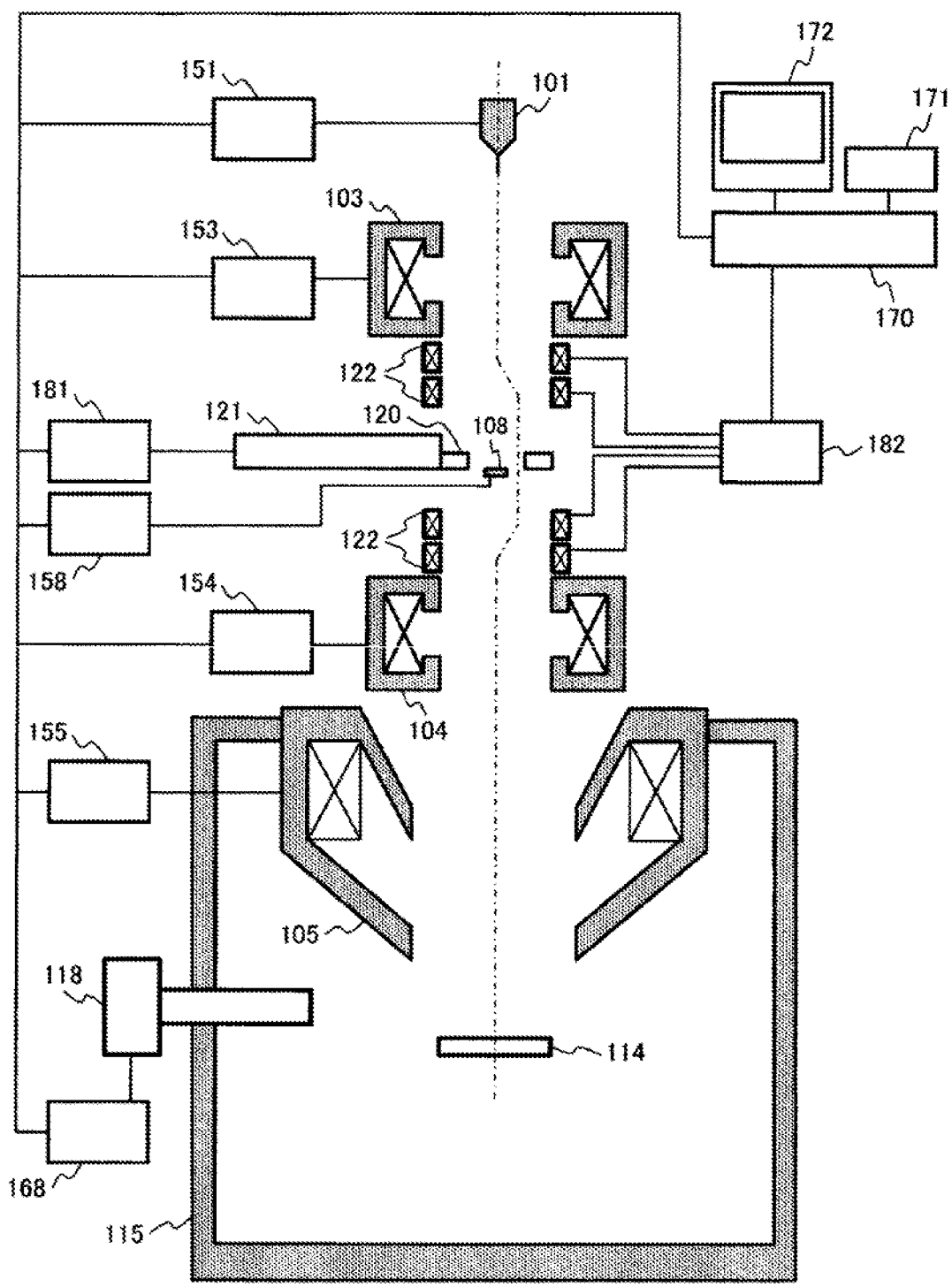
[FIG. 6]

[FIG. 7]
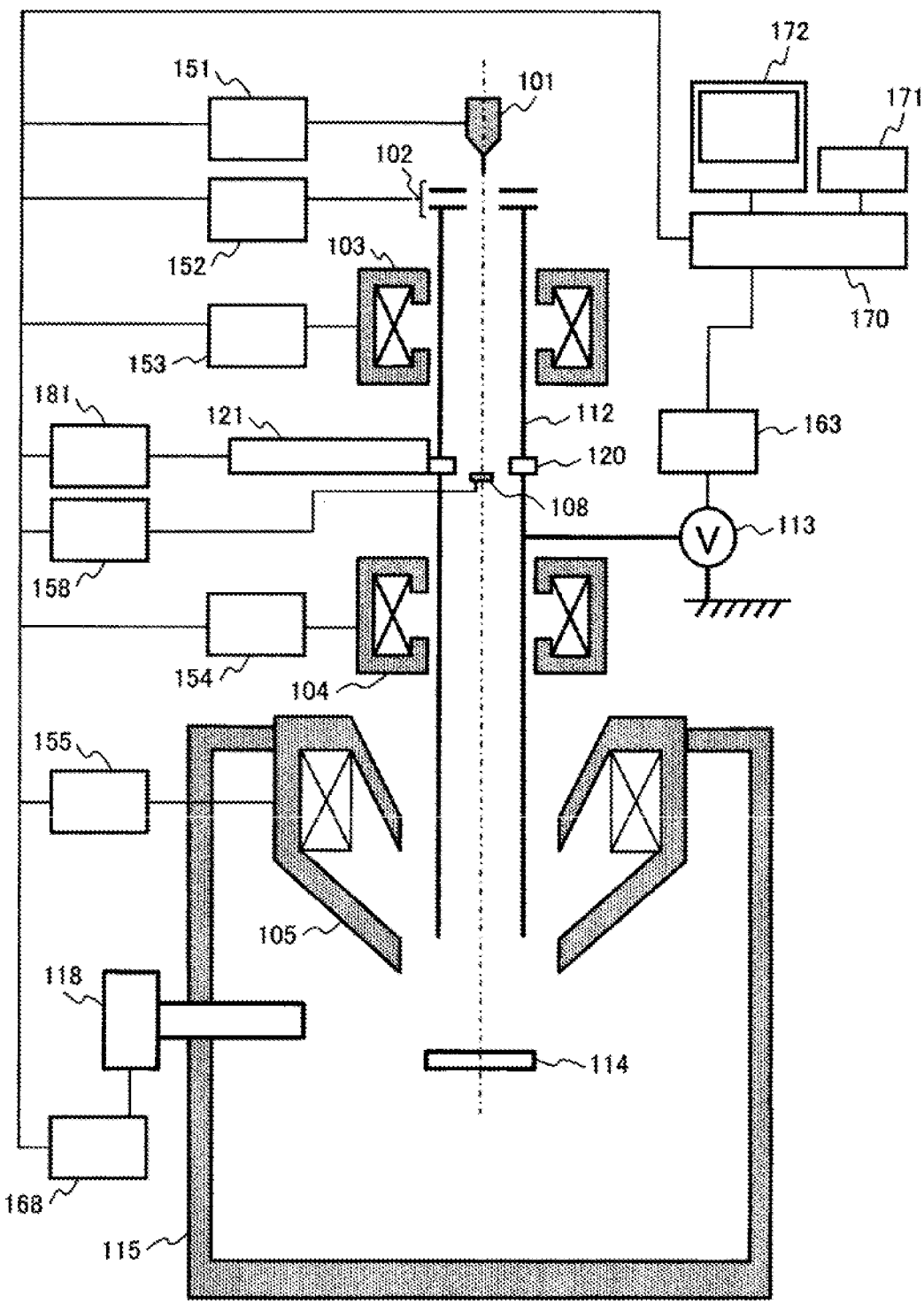

CHARGED PARTICLE BEAM DEVICE

TECHNICAL FIELD

The present invention relates to a charged particle beam device.

BACKGROUND ART

An electron microscope capable of observing a nano level is used in various fields such as a semiconductor field, a material field and a bio field. A scanning electron microscope (SEM), a transmission electron microscope (TEM), a scanning transmission electron microscope (STEM) or the like acquires structure information and composition information of a sample by irradiating an observation sample with electrons emitted from an electron source, and detecting secondary electrons and backscattered electrons emitted from the sample, or electrons transmitted through the sample. Therefore, the acquired sample information largely depends on a configuration of a detector. This point is not limited to the electron microscope but is the same in other microscopes such as an ion microscope.

Regarding the detection of signal electrons passing near an optical axis, there is known a signal detection system using an annular detector in a signal detection method in a booster optical system (PTL 1). A method of deflecting signal electrons is also known (PTL 2).

PRIOR ART LITERATURE

Patent Literature

PTL 1: JP-A-2000-30654
PTL 2: JP-A-7-192679

SUMMARY OF INVENTION

Technical Problem

For the detection of signal electrons with high energy that pass near an optical axis, for example, backscattered electrons (BSE) or secondary electrons (SE) in a booster optical system, in the method of PTL 1, it is difficult to detect a signal near the optical axis with a circular aperture on an irradiation axis (optical axis) of the charged particle beam. Meanwhile, in the method of PTL 2, it is considered that a large problem does not occur due to deflection when the energy of the signal electrons is low, but when the energy of the signal electrons is high, in order to obtain a sufficient deflection angle, an irradiation electron beam (primary electron beam) is also affected. In addition, when the signal electrons are deflected and detected, it is difficult to uniformly detect the signal electrons axially symmetrically emitted with respect to the optical axis.

Solution to Problem

A charged particle beam device includes a charged particle beam source configured to generate a charged particle beam; an objective lens configured to focus the charged particle beam to a sample; and a first charged particle detecting element disposed between the charged particle beam source and the objective lens and configured to detect charged particles generated by an interaction between the charged particle beam and the sample, in which a detection surface of the first charged particle detecting element is disposed on a center axis of the objective lens.

Advantageous Effect

Signal electrons with high energy that pass near an optical axis can be detected. An interference fringe caused by secondary charged particles can be detected.

BRIEF DESCRIPTION OF DRAWINGS

FIG. 1 is a schematic view of a charged particle beam device according to a first embodiment.
FIG. 2A is a view illustrating the configuration of a charged particle detecting element.
FIG. 2B is a view illustrating the configuration of the charged particle detecting element.
FIG. 2C is a view illustrating the configuration of the charged particle detecting element.
FIG. 3 is an example of a charged particle beam aperture unit that has a plurality of apertures.
FIG. 4 is another schematic view of the charged particle beam device according to the first embodiment.
FIG. 5 is another schematic view of the charged particle beam device according to the first embodiment.
FIG. 6 is a schematic view of a charged particle beam device according to a second embodiment.
FIG. 7 is a schematic view of a charged particle beam device according to a third embodiment.

DESCRIPTION OF EMBODIMENTS

Embodiments will be described with reference to the drawings. It should be noted that the configuration example is only an example for carrying out the invention and the technical scope of the invention is not limited thereto. Also, the same reference numerals are assigned to common configurations in the drawings, and description thereof is omitted.

First Embodiment

The configuration of a first embodiment is illustrated in FIG. 1. A charged particle optical system of a charged particle beam device includes a charged particle beam source 101 that generates a charged particle beam, a first and a second condenser lens 103, 104 that focus the charged particle beam emitted from the charged particle beam source 101, a charged particle beam aperture 120 that shields a part of the charged particle beam emitted from the charged particle beam source 101, a charged particle beam aperture unit 121 that supports the charged particle beam aperture 120, and an objective lens 105 that focuses the charged particle beam to a sample. An observation sample 114 to be irradiated with the charged particle beam from the charged particle optical system is disposed in a sample chamber 115. When the observation sample 114 is irradiated with the charged particle beam, charged particles are generated by an interaction between the charged particle beam and the observation sample.

In order to detect the charged particles (secondary charged particles) generated by the interaction with the observation sample, in a configuration example of FIG. 1, a charged particle detecting element 108 having a detection surface disposed at a center of the charged particle beam aperture 120 and a sample chamber detector 118 disposed in the sample chamber are provided. The plurality of detectors is provided as described above, so as to separately detect the charged particles having different energy and emission angles. A case where an electron beam is used as the charged particle beam will be described as an example. The electrons in the sample are excited by incident electrons, and the electrons emitted into vacuum are secondary electrons (narrow sense), and the energy thereof is generally defined as 50 eV or less. Meanwhile, the electrons emitted from a sample surface after the incident electrons are scattered in the sample are backscattered electrons, the backscattered electrons have high energy, and the energy thereof is generally 50 eV or more. The secondary electrons with low energy are detected by the sample chamber detector 118 disposed outside a charged particle beam column in which the charged particle optical system is disposed, and the backscattered electrons with high energy are detected by the charged particle detecting element 108 disposed in the charged particle beam column.

Controllers for controlling each configuration of the charged particle optical system, the sample chamber and the detector are provided. That is, a charged particle beam source controller 151 that controls the charged particle beam source 101, a first condenser lens controller 153 that controls the first condenser lens 103, a second condenser lens controller 154 that controls the second condenser lens 104, a charged particle beam aperture unit controller 181 that controls the charged particle beam aperture unit 121, an objective lens controller 155 that controls the objective lens, a charged particle detecting element controller 158 that controls the charged particle detecting element 108 and a sample chamber detector controller 168 that controls the sample chamber detector 118 are provided. These controllers are controlled by an integrated computer 170 that controls overall operations of the charged particle beam device and generates a charged particle beam image from a charged particle signal detected by the detectors. In addition to the controllers, the integrated computer 170 is connected with a controller (keyboard, mouse and the like) 171 by which an operator inputs various instructions such as irradiation conditions, electrode voltage conditions and position conditions, and a display 172 that displays the acquired charged particle beam image and a control screen of the charged particle beam device to the operator.

FIG. 1 only illustrates main parts of the charged particle beam device, and a deflection system for shifting and scanning the observation sample 114 with the charged particle beam emitted from the charged particle beam source 101, and a stage mechanism that places the observation sample 114 are provided according to functions of the device, for example. Further, in the example shown in FIG. 1, there are two condenser lenses for controlling the charged particles incident on the objective lens, but the number of the condenser lens is not limited thereto. The objective lens may be a lens of a type that does not leak a magnetic field to an outside of a magnetic path, or may be a lens of a type that leaks a magnetic field to an outside of a magnetic path, or may be a composite objective lens including both the type that leaks the magnetic field and the type that does not leak the magnetic field. Since the type of the lens is not limited for the purpose of focusing the charged particle beam on the sample, the condenser lens and the objective lens are not limited to a magnetic field lens and may be electrostatic lenses. However, in particular, since the objective lens 105 disposed close to the observation sample 114 may exert an effect of accelerating or decelerating the charged particles emitted from the observation sample 114, it is necessary to set an observation condition in consideration of the effect.

Further, the charged particle beam column provided in the charged particle beam device is not limited to one, and may be a composite charged particle beam device including a plurality of the charged particle beam columns.

The configuration of the charged particle detecting element 108 will be described with reference to FIGS. 2A to 2C. The charged particle detecting element 108 is disposed at a center position of an opening portion of the charged particle beam aperture 120 by three detecting element support portions 110. The charged particle beam aperture 120 may be a circular aperture 120a (FIGS. 2A and 2C) or an annular aperture 120b (FIG. 2B). The annular aperture 120b is an aperture provided with a shielding portion that shields the charged particle beam also at the center position of the opening portion of the circular aperture. Since a shape and a size of the shielding portion at the center position of the annular aperture 120b are substantially the same as those of the charged particle detecting element 108, a top view of the case where the charged particle detecting element 108 is provided in the annular aperture 120b is substantially the same as the top view of FIG. 2A. Although sizes of the charged particle detecting element 108 and the charged particle beam aperture 120 are not particularly limited, a diameter of the charged particle detecting element is about 60 μm, and an inner diameter of the opening portion of the charged particle beam aperture is about 80 to 100 μm.

Further, the charged particle detecting element 108 may be configured by a light detecting element 107 on which a scintillator 109 is stacked (FIG. 2C). In this case, instead of being directly detected, the electrons are converted into light (scintillator light) by the scintillator 109, and then the converted light (scintillator light) is detected by the light detecting element 107. Since the charged particle detecting element 108 (or the light detecting element 107) needs to be small, a solid-state detector such as a semiconductor element (Charge-Coupled Device (CCD), photo diode, and photo diode array), or a silicon photomultiplier (SiPM) is used. For example, in a field of a CMOS image sensor, a sensor structure having a pixel size of 2 μm or less has been reported, and these techniques can be used.

Further, the charged particle detecting element 108 may be configured by a plurality of the charged particle detecting elements including a first charged particle detecting element disposed at the center position of the opening portion of the charged particle beam aperture 120, and a second charged particle detecting element disposed around the opening portion of the charged particle beam aperture 120. By using the plurality of charged particle detecting elements, a detection area that detects the charged particles from the sample can be increased. In this case, it is a preferably configured such that signal output of the first charged particle detecting element is separated from signal output of the second charged particle detecting element, so that only the signal output of the first charged particle detecting element can be output. Since the signal output of the second charged particle detecting element detects a charged particle slightly away from an optical axis, it may be desirable to only observe at the signal output of the first charged particle detecting element, as in a case of detecting interference between the charged particles to be described later.

In addition, a detecting element signal line 111 for extracting a detection signal from the charged particle detecting element 108 (or the light detecting element 107) to the outside is disposed in one of the detecting element support portions 110. For the purpose of extracting the signal, the detecting element signal line 111 may be disposed separately from the detecting element support portion 110, but it is desirable to dispose the detecting element signal line 111 in the detecting element support portion 110, so as to minimize influence on the charged particle beam from the charged particle beam source 101. Further, in a case where a high voltage is applied to the scintillator 109, it is desirable that a voltage supply wire for supplying the high voltage is also disposed on one of the detecting element support portions 110. In the example of FIG. 2A, in consideration of deflection and rotation of the support portions 110, the charged particle detecting element 108 is supported by the three support portions, but the number of the support portions is not limited to three. Instead of being supported by the charged particle beam aperture 120, a charged particle detector unit that supports the charged particle detecting element 108 may be provided separately from the charged particle beam aperture unit 121 including the charged particle beam aperture. In this case, the charged particle detecting element 108 of this embodiment can be also applied to the charged particle optical system without the charged particle beam aperture 120, or be applied to the charged particle optical system (see FIG. 4) in which the charged particle detecting element 108 is disposed away from the charged particle beam aperture 120.

In this way, by disposing the charged particle detecting element 108 on the optical axis of the charged particle beam, a S/N decreases due to a decrease in a light amount of the charged particle beam, and meanwhile, resolution is improved by focusing the charged particle beam, so that the observation condition may be obtained in a balance therebetween. Advantages of disposing the detection surface of the charged particle detecting element 108 on the optical axis of the charged particle beam will be described later.

As illustrated in FIG. 3, the charged particle beam aperture unit 121 may include one or more circular apertures separately from the aperture on which the charged particle detecting element 108 is supported. An example of FIG. 3 is an example in which a plurality of circular apertures 120c to 120e having different opening diameters are provided. Accordingly, an insertion state and a retreat state of the charged particle detecting element can be selected, and a general irradiation condition and the irradiation condition of the present embodiment can be selected, so that a width of the observation can be expanded. When the charged particle detector unit that supports the charged particle detecting element is provided, the same effect can be implemented by providing a drive mechanism to the charged particle detector unit such that the insertion state and the retreat state of the charged particle detecting element can be selected.

FIG. 4 illustrates an example in which the charged particle beam aperture 120 and the charged particle detector 108 are disposed separately from each other. The charged particle detecting element 108 is disposed on the optical axis of the charged particle beam or on a center axis of the objective lens 105 and at a position away from the charged particle beam aperture 120, so that the charged particle detecting element 108 can be disposed under the charged particle beam column (a side close to the objective lens 105), and the width of the observation is expanded. With this arrangement, the irradiation conditions such as a current amount and an opening angle of the charged particle beam emitted on the sample and a detection of the charged particles caused by the interaction between the charged particle beam and the observation sample can be separated with each other and optimized.

FIG. 5 illustrates another modification. In the example shown in FIG. 5, the scintillator 109 is disposed on the optical axis (the central axis of the objective lens 105) of the charged particle beam, and a mirror 106 and a light detecting element 107 are disposed above the scintillator 109. The scintillator 109 has a structure shielded from the charged particle beam from the charged particle beam source 101. A light detecting element controller 157 that controls the light detecting element 107 is also provided, and is controlled by the integrated computer 170. The mirror 106 has an opening through which the optical axis of the charged particle beam passes, and is configured to detect light (scintillator light) extending from the scintillator. The mirror may be supported over the optical axis, or a mirror having an annular shape may be used. In particular, when the scintillator 109 and the mirror 106 are disposed close to each other, detection efficiency of the scintillator light can be improved by providing a mirror over the optical axis of the charged particle beam. Alternatively, a prism may be used instead of the mirror. Further, the mirror or the prism may include a mechanism for changing an angle with respect to a scintillator surface. In addition, a light guide, an optical lens, an optical fiber, or the like may be disposed between the scintillator 109 and the mirror 106 (or the prism) or between the mirror 106 (or the prism) and the light detecting element 107, so that transmission loss therebetween is decreased. Further, only the optical fiber may be used to guide the scintillator light to the light detecting element.

By disposing the detection surface of the charged particle detecting element on the optical axis of the charged particle beam (the central axis of the objective lens), the secondary charged particles traveling on the optical axis or near the optical axis can be detected. The charged particles generated by the interaction between the charged particle beam and the sample are generally referred to as "secondary charged particles". For example, the secondary electrons (narrow sense) and the backscattered electrons are the secondary charged particles. Here, when an example in which the backscattered electrons are detected as the secondary charged particles is taken, a generated amount of the backscattered electrons varies depending on elements constituting the sample, so that backscattered electron images are used for confirming composition distribution in the sample. When the charged particle detector is disposed at a predetermined angle with respect to the optical axis of the charged particle beam as in the related art, the detection signal of the backscattered electrons includes not only composition information, but also information including unevenness information on the sample surface. In contrast, by detecting the backscattered electrons by the charged particle detecting element disposed on the optical axis of the charged particle beam, the unevenness information on the sample surface can be eliminated, and the composition information can be more selectively acquired.

In a method, in the related art, of deflecting the secondary charged particles to detect the secondary charged particles near the optical axis (see PTL 2), it is difficult to uniformly detect the secondary charged particles emitted to the axial object with respect to the optical axis by the deflection, but by disposing the detection surface on the optical axis, the electrons emitted at the same angle with respect to the optical axis can be uniformly detected. Since the secondary charged particles are not deflected, the secondary charged particles travelling on the optical axis or near the optical axis can be detected without influence on the charged particle beam such as distortion even in a case of the secondary charged particles with high energy.

Further, it is possible to detect the interference between the secondary charged particles axially symmetrically emitted with respect to the optical axis and the secondary charged particles traveling on the optical axis. As a result, it is possible to improve spatial resolution. For example, interference between the secondary charged particles traveling on the optical axis and the secondary charged particles axially symmetrically emitted with respect to the optical axis can be detected from the sample surface. When the secondary charged particles traveling on the optical axis are shielded below the detecting element, the interference between the secondary charged particles axially symmetrically emitted with respect to the optical axis can be detected. In this case, since an interference fringe is formed parallel to the optical axis, the interference fringe is not easily affected by an energy spread of the secondary charged particles. That is, a detection sensitivity of the interference fringe can be improved. In the related art, an interference image between transmitted electrons and scattered electrons is observed in a transmission electron microscope (TEM) or the like, but in the present embodiment, it is possible to detect the interference caused by the secondary charged particles emitted or reflected from the sample, which is a feature of the present embodiment that no other detection methods are used. In order to shield the secondary charged particles traveling on the optical axis below the detecting element, specifically, another charged particle detecting element having the same shape is disposed between the charged particle detecting element 108 and the observation sample. In this case, the secondary charged particles traveling on the optical axis can be detected by the other charged particle detecting element, and the interference between the secondary charged particles axially symmetrically emitted with respect to the optical axis can be detected by the charged particle detecting element 108. Alternatively, the annular aperture may be disposed between the charged particle detecting element and the observation sample. The shielding portion provided at the center position of the opening portion of the annular aperture is disposed on the central axis of the objective lens.

Further, by making the detection surface of the charged particle detecting element disposed on the optical axis of the charged particle beam adjustable, versatility can be improved. In order to obtain technical effect described above, it is desirable that the center of the charged particle detector is matched with the optical axis of the charged particle beam (or the central axis of the objective lens). Therefore, it is desirable that position adjustment in a plane surface perpendicular to the optical axis can be performed. Further, when the interference between the secondary charged particles traveling on the optical axis and the secondary charged particles axially symmetrically emitted with respect to the optical axis is detected from the sample surface, the position adjustment in an optical axis direction is also important. Therefore, it is desirable that the position adjustment can also be performed in the optical axis direction.

In addition, the technical effect described above is based on a premise that a plane surface of the sample is perpendicular to the optical axis. For example, effect that the composition information of the sample can be more selectively acquired is realized by detecting the backscattered electrons that is emitted perpendicular to the plane surface of the sample so as to not being affected by the unevenness of the sample surface. Further, the interference of the secondary charged particles in the detection is also assumed as the interference with the secondary charged particles emitted perpendicularly to the plane surface of the sample. Therefore, when the plane surface of the sample is inclined, in order to be capable of adjusting the detection surface of the charged particle detecting element on a trajectory of the charged particle emitted perpendicularly to the plane surface of the inclined sample, it would be better that an angle formed between the detection surface of the charged particle detecting element and the center axis of the objective lens (or the optical axis of the charged particle beam) can be adjusted.

Therefore, an electric drive mechanism for adjusting the detection surface of the charged particle element is provided such that operations can be performed on the control screen displayed on the display 172. Further, it is convenient if a storage area that stores positions of the detection surface of the set charged particle element is provided in the integrated computer 170, and the positions can be called out by the operations on the control screen. The mechanism for driving the detection surface may be a motor drive or a piezo drive. Further, both the drives may be used differently depending on an amount of adjustment. A trajectory change of the secondary charged particles may be caused not only when the surface of the sample is inclined but also by changing the irradiation conditions of the charged particle beam such as an acceleration voltage and the current amount. Even in such a case, if a function that adjusts the position and the angle of the detection surface of the charged particle element with respect to the optical axis of the charged particle beam or the central axis of the objective lens is provided, it is possible to perform adjustment for each of the irradiation conditions.

Second Embodiment

FIG. 6 illustrates the configuration of a charged particle beam device of a second embodiment. In the charged particle beam device shown in FIG. 6, a detection surface of the charged particle detecting element 108 is disposed on a center axis of an objective lens, but is not disposed on an optical axis of a charged particle beam.

Therefore, a charged particle beam column illustrated in FIG. 6 includes a deflector group 122 that deflect the charged particle beam emitted from the charged particle beam source 101, and a deflector group controller 182 that controls the deflector group. The deflector group controller 182 is controlled by the integrated computer 170. In FIG. 6, the deflector group 122 includes four deflectors, but the number of the deflectors is not limited as long as the charged particle beam can be deflected to avoid the detection surface of the charged particle detecting element 108. For example, a configuration may be adopted in which the optical axis when being emitted from the charged particle beam source and the optical axis when a sample is irradiated become parallel to each other by using a two-stage deflector group.

As a result, the charged particle beam with which the sample is irradiated is not shielded by the charged particle detecting element 108. Therefore, an irradiation current higher than the configuration of the first embodiment can be realized. The configuration of FIG. 6 is an example in which the deflector group for avoiding the detection surface of the charged particle detecting element 108 is provided for the configuration of FIG. 1, and the same effect can be obtained by providing the configurations shown in FIGS. 4 and 5 which are modifications of the first embodiment with the deflector group for avoiding the detection surface of the charged particle detecting element 108 or the scintillator 109.

Third Embodiment

FIG. 7 illustrates the configuration of a charged particle beam device of a third embodiment. The charged particle beam device shown in FIG. 7 is characterized in that a beam tube is provided in a charged particle beam column. That is, an acceleration electrode 102 that accelerates the charged particle beam emitted from the charged particle beam source 101, an acceleration electrode controller 152 that controls the acceleration electrode, a beam tube 112 disposed from the acceleration electrode to a vicinity of a lower end of an objective lens, a beam tube power supply 113 that supplies a voltage to the beam tube, and a beam tube controller 163 that controls the beam tube power supply are provided. The acceleration electrode controller 152 and the beam tube controller 163 are controlled by the integrated computer 170.

Secondary charged particles with low energy emitted from the sample, such as secondary electrons, are accelerated by a voltage of the beam tube and go straight through the charged particle beam column. This makes detecting interference in secondary charged particles with low energy possible.

An acceleration mechanism of the secondary charged particle is not limited to the beam tube illustrated in FIG. 7, and the same effect can be obtained also in a charged particle beam device to which a deceleration optical system that applies a negative high voltage to a stage on which an observation sample 114 is placed is applied. The deceleration optical system that decelerates the charged particle beam (electron beam) directed to the observation sample 114 from the charged particle beam source 101 has an effect of accelerating secondary charged particles (secondary electrons) emitted or reflected from the observation sample 114.

Further, by providing a deflector group for avoiding a detection surface of the charged particle detecting element 108 in combination with the second embodiment, a higher irradiation current can be realized.

REFERENCE SIGN LIST

101: Charged particle beam source
102: Acceleration electrode
103: First condenser lens
104: Second condenser lens
105: Objective lens
106: Mirror
107: Light detecting element
108: Charged particle detecting element
109: Scintillator
110: Detecting element support portion
111: Detecting element signal line
112: Beam tube
113: Beam tube power supply
114: Observation sample
115: Sample chamber
118: Sample chamber detector
120: Charged particle beam aperture
121: Charged particle beam aperture unit
122: Deflector group
151: Charged particle beam source controller
152: Acceleration electrode controller
153: First condenser lens controller
154: Second condenser lens controller
155: Objective lens controller
157: Light detecting element controller
158: Charged particle detecting element controller
163: Beam tube controller
168: Sample chamber detector controller
170: Integrated computer
171: Controller
172: Display
181: Charged particle beam aperture unit controller
182: Deflector group controller

The invention claimed is:

1. A charged particle beam device comprising:
a charged particle beam source configured to generate a charged particle beam;
an objective lens configured to focus the charged particle beam to a sample;
a first charged particle detecting element disposed between the charged particle beam source and the objective lens and configured to detect charged particles generated by an interaction between the charged particle beam and the sample; and
a drive mechanism configured to adjust an angle formed between a position of the detection surface of the first charged particle detecting element or the detection surface of the first charged particle detecting element and the center axis of the objective lens, wherein
a detection surface of the first charged particle detecting element is disposed on an center axis of the objective lens.

2. A charged particle beam device comprising:
a charged particle beam source configured to generate a charged particle beam;
an objective lens configured to focus the charged particle beam to a sample;
a first charged particle detecting element disposed between the charged particle beam source and the objective lens and configured to detect charged particles generated by an interaction between the charged particle beam and the sample; and
a first charged particle beam aperture disposed on an optical axis of the charged particle beam and having an opening portion, wherein
the first charged particle detecting element is disposed on a center position of the opening portion of the first charged particle beam aperture.

3. The charged particle beam device according to claim 2, wherein
the first charged particle beam aperture is an annular aperture having a shielding portion that shields the charged particle beam on the center position of the opening portion, and
the first charged particle detecting element is disposed in the shielding portion of the annular aperture.

4. The charged particle beam device according to claim 2, further comprising:
a second charged particle detecting element disposed around the opening portion of first charged particle beam aperture, wherein
signal output of the first charged particle detecting element and signal output of the second charged particle detecting element are able to be separately output.

5. The charged particle beam device according to claim 2, further comprising:
a second charged particle beam aperture in which the charged particle detecting element is not disposed in the opening portion; and
a charged particle beam aperture unit that selectively supports the first charged particle beam aperture and the second charged particle beam aperture.

6. The charged particle beam device according to claim 2, wherein
the charged particle detecting element includes a scintillator configured to convert the charged particles generated by the interaction between the charged particle beam and the sample into scintillator light; and a light detecting element configured to detect the scintillator light.

7. The charged particle beam device according to claim 1, further comprising:
a deflector group configured to deflect the charged particle beam, wherein
the charged particle beam generated from the charged particle beam source avoids the detection surface of the first charged particle detecting element by the deflectors and is incident on the objective lens.

8. The charged particle beam device according to claim 1, further comprising:
an acceleration mechanism configured to accelerate the charged particles generated by the interaction between the charged particle beam and the sample, wherein
the first charged particle detecting element is configured to detect the charged particles accelerated by the acceleration mechanism.

9. A charged particle beam device comprising:
a charged particle beam source configured to generate a charged particle beam;
an objective lens configured to focus the charged particle beam to a sample;
a first charged particle detecting element disposed between the charged particle beam source and the objective lens and configured to detect charged particles generated by an interaction between the charged particle beam and the sample; and
a drive mechanism configured to adjust an angle formed between a position of a detection surface of the first charged particle detecting element or the detection surface of the first charged particle detecting element and an center axis of the objective lens, wherein
the detection surface of the first charged particle detecting element is disposed on the center axis of the objective lens, and detects an interference between the charged particles generated by the interaction between the charged particle beam and the sample.

10. The charged particle beam device according to claim 9, wherein
the drive mechanism includes an electric drive mechanism.

11. The charged particle beam device according to claim 9, further comprising:
a second charged particle detecting element, wherein
a detection surface of the second charged particle detecting element is disposed on the optical axis of the objective lens and between the first charged particle detecting element and the sample.

12. The charged particle beam device according to claim 9, further comprising:
an annular aperture having a shielding portion on a center position of an opening portion,
wherein the shielding portion of the annular aperture is disposed on the optical axis of the objective lens between the first charged particle detecting element and the sample.

* * * * *